(12) United States Patent
Amato et al.

(10) Patent No.: US 7,622,997 B2
(45) Date of Patent: Nov. 24, 2009

(54) METHOD FOR DYNAMICALLY TUNING THE CLOCK FREQUENCY OF AN OSCILLATOR AND CORRESPONDING OSCILLATING SYSTEM

(75) Inventors: Stefano Amato, Vimercate (IT);
Francesco Mannino, Genoa (IT);
Massimiliano Picca, Muggiò (IT);
Mirko Scapin, San Giorgio delle Pertiche (IT)

(73) Assignee: STMicroelectronics S.r.L., Agrate Brianza (MI) (IT)

( * ) Notice: Subject to any disclaimer, the term of this patent is extended or adjusted under 35 U.S.C. 154(b) by 37 days.

(21) Appl. No.: 11/770,138

(22) Filed: Jun. 28, 2007

(65) Prior Publication Data
US 2008/0042720 A1    Feb. 21, 2008

(30) Foreign Application Priority Data
Jun. 30, 2006    (IT) .......................... MI2006A1272

(51) Int. Cl.
*H03L 7/00*    (2006.01)
(52) U.S. Cl. ............................ 331/16; 331/34; 331/176
(58) Field of Classification Search .................. 331/1 R, 331/1 A, 10–12, 16–18, 25, 34, 175, 176, 331/177 R; 327/156–162, 292, 298; 375/373–376
See application file for complete search history.

(56) References Cited

U.S. PATENT DOCUMENTS

2005/0226357 A1*  10/2005  Yoshimura .................. 375/376
2006/0284688 A1*  12/2006  Miki ........................... 331/16

* cited by examiner

*Primary Examiner*—James H. Cho
*Assistant Examiner*—Jany Tran
(74) *Attorney, Agent, or Firm*—Lisa K. Jorgenson; Allen, Dyer, Doppelt, Milbrath & Gilchrist, P.A.

(57) ABSTRACT

An oscillator system may include an oscillator block having a plurality of inputs and outputting a clock signal, a frequency divider block receiving the clock signal and outputting a divided clock signal, a tuning block receiving the divided clock signal and outputting a comparison signal, and a control block coupled to the tuning block. The control block may receive the comparison signal. The control block may include a configuration block for producing a plurality of outputs for the corresponding inputs of the oscillator block, and an Up/Down counter having outputs applied to the configuration block.

17 Claims, 7 Drawing Sheets

METHOD FOR DYNAMICALLY TUNING THE CLOCK FREQUENCY OF AN OSCILLATOR AND CORRESPONDING OSCILLATING SYSTEM

FIELD OF THE INVENTION

The present invention relates to a method for dynamically tuning a clock frequency emitted by an oscillator, and to an oscillator system comprising an oscillator block having a plurality of inputs and a clock signal output.

BACKGROUND OF THE INVENTION

As known in the relevant technical field, an electronic device may comprise a microprocessor, a state machine, or digital components, and may need a scanning or timing signal for evolving from one state to another. Within this context, it may be important to accurately regulate the frequency of this timing or clock signal to maximize the performance of the system.

It is also known that dimensions and costs may be important aspects in the development of an electronic device. To the purpose of accurate regulation of the clock frequency, it may be suitable to use an oscillator of the integrated type, avoiding approaches comprising discrete components, such as, for example, quartz oscillators. However, although quartz oscillators may be characterized by good accuracy and a decrease in the final costs of the electronic device, they may have unacceptable dimensions for many applications.

Unfortunately, the characteristics and performance of an integrated oscillator may depend on the variations in the manufacturing technological process, the supply voltage variations, and the temperature variations. Thus, when designing such a device, a prerequisite may comprise checking the behavior of the device having the oscillator under all the possible operation conditions. Another prerequisite during design may be dimensioning and configuring each part of the device so that it operates correctly.

More particularly, it is the frequency of the integrated oscillator that undergoes great variations with respect to the desired value due to: the variations of the technological process, the variations in the supply voltage, and the variations in the temperature variation. At the end of the manufacturing process, it may be difficult to emphasize the importance of an accurate oscillator frequency, with respect to the optimum design frequency. Overcoming the limit value at which the digital circuits can switch correctly, may cause a failure of the system.

With respect to an optimum frequency set when designing the oscillator, which hereafter may be called target frequency $f_{TARGET}$, it may be helpful to generate a frequency value lower than $E \cdot f_x$, where E is the highest percentage error due to: the manufacturing process variation, the supply voltage variation, and the temperature variation, and $f_x$ is the frequency at which the oscillator may effectively operate while being immune from the above variations. More precisely, the value of the percentage error may be due to three contributions, $E=Ep+Ev+Et$, respectively, due to the variations: of the manufacturing process, of the supply voltage, and of the temperature.

To compensate for these possible errors due to several processes, supply and temperature variations may be:

$$f_x + (f_x \cdot E) \leq f_{TARGET} \qquad (1)$$

The highest value of $f_x$ is given by:

$$f_x + (f_x \cdot E) = f_{TARGET} \qquad (2)$$

Then:

$$f_x = \frac{f_{TARGET}}{(1+E)} \qquad (3)$$

From the relation (3), it may be appreciated that the lower the value of the percentage error E, then the closer the effective operation frequency value $f_x$ may move towards the $f_{TARGET}$ value, i.e. to the weighted value. At present, Applicants submit that it appears that no technical approach is known that allows automatic realization of dynamic tuning of the clock frequency in an oscillator so as to regulate its value at the end of the semiconductor manufacturing process.

SUMMARY OF THE INVENTION

An object of the present invention is providing an oscillator architecture that allows for minimizing or reducing the error E due to: the variation of the technological process, the variation of the temperature, and the variation of the supply voltage. Thereby, the oscillator system may be tuned through an electric magnitude signal, the electric magnitude signal being different from the frequency of the modulated output signal.

An oscillator system may include an oscillator block having a plurality of inputs and outputting a clock signal, a frequency divider block receiving the clock signal and outputting a divided clock signal, a tuning block receiving the divided clock signal and outputting a comparison signal, and a control block coupled to the tuning block. The control block may receive the comparison signal. The control block may include a configuration block for producing a plurality of outputs for the corresponding inputs of the oscillator block, and an Up/Down counter having outputs applied to the configuration block.

A method is for dynamically tuning a clock frequency emitted by an oscillator comprising at least one oscillator block, the oscillator block having a plurality of inputs and outputting a clock signal. The method may comprises dividing the clock signal produced by the oscillator block with a frequency divider block, integrating the divided clock signal from the frequency divider block into an electric magnitude signal with a tuning block having an integrator, and comparing the electric magnitude signal with a reference signal in the tuning block. The method may further include applying a signal from the comparing to a control block comprising an Up/Down counter and a configuration block for the oscillator block, the applying for regulating values of the plurality of inputs.

The characteristics and the advantages of the tuning method and of the related oscillator system may be apparent from the following description of an embodiment thereof given by way of indicative and nonlimiting example with reference to the annexed drawings.

DETAILED DESCRIPTION OF THE PREFERRED EMBODIMENTS

Figure 1:
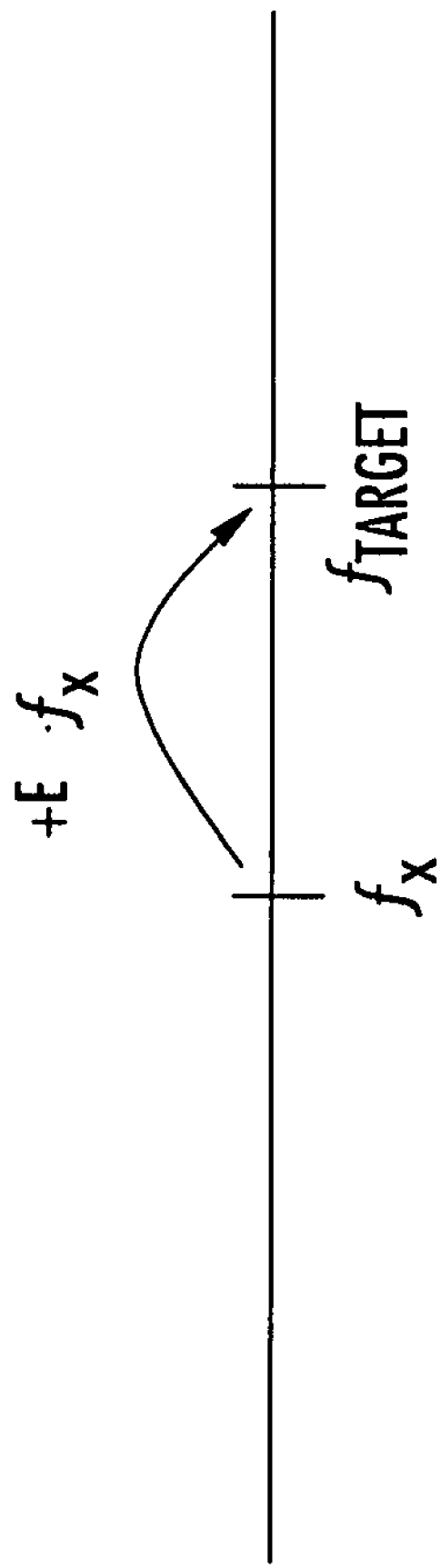
FIG. 1 illustrates graphically, on a frequency axis, a point corresponding to an optimum frequency, called the target frequency $f_{TARGET}$, and a lower frequency $f_x$, distant from the optimum frequency of a value E, according to the present invention.
Figure 2:
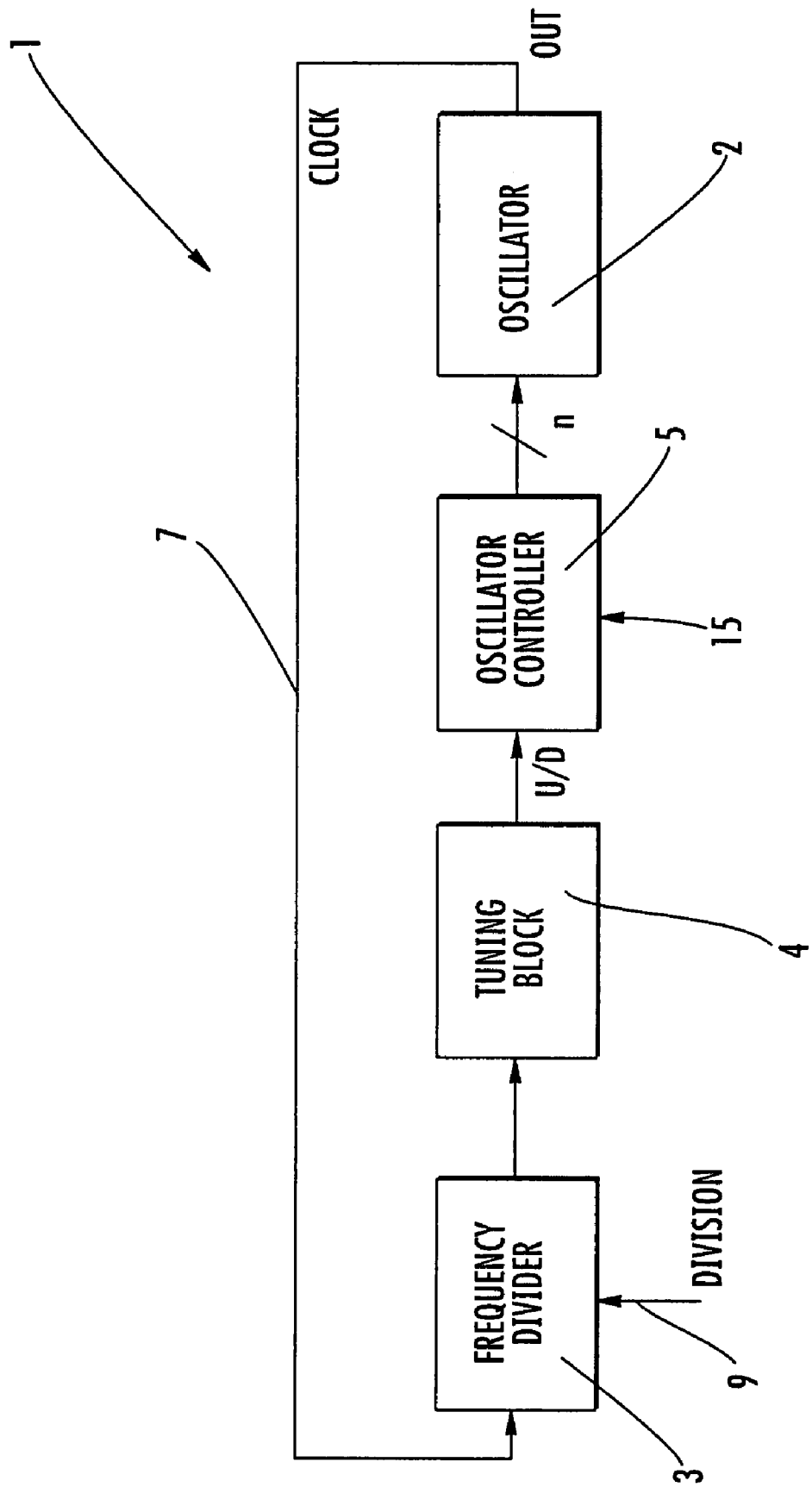
FIG. 2 illustrates a schematic view of an oscillator system according to the present invention.
Figure 3:
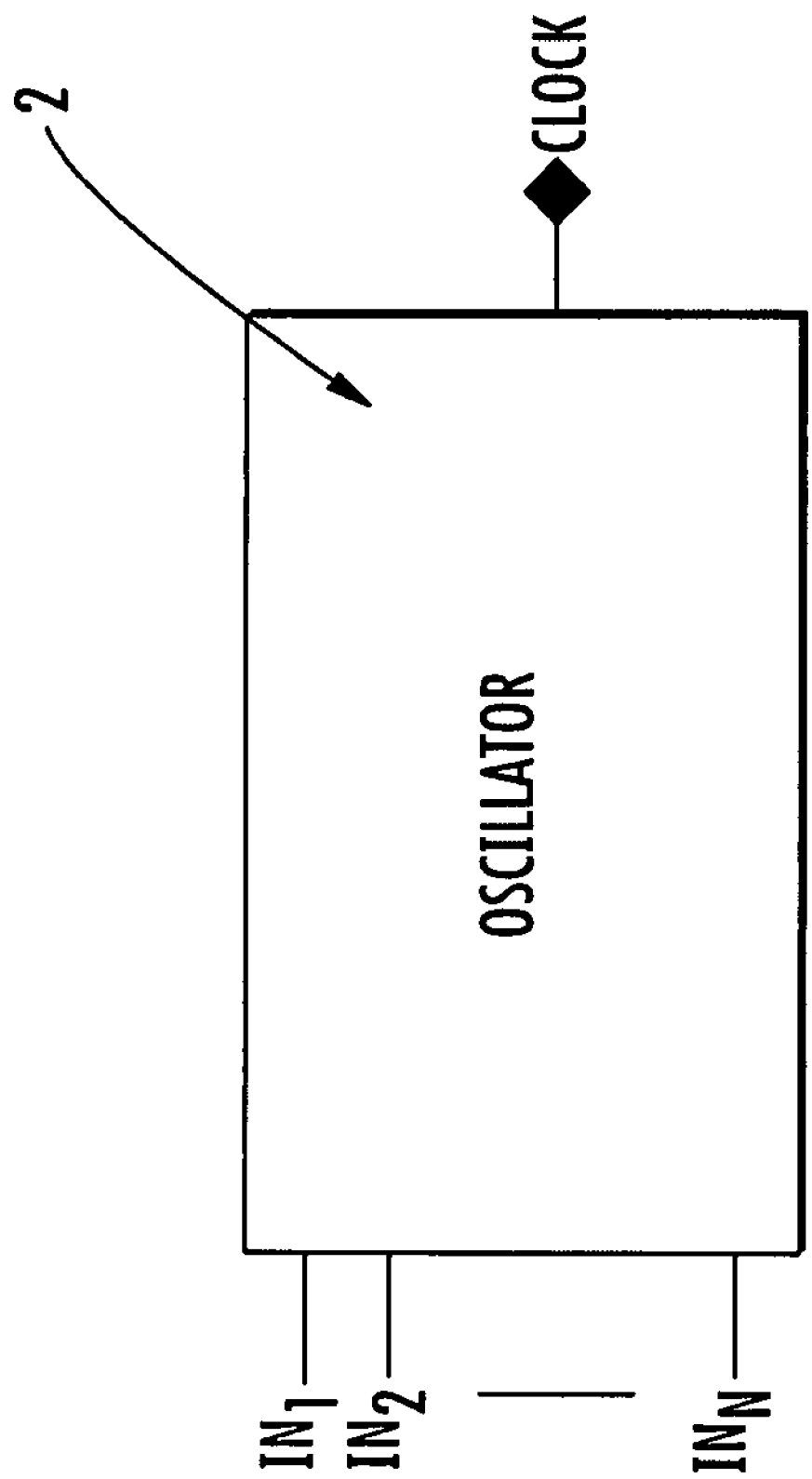
FIG. 3 illustrates a schematic view of an oscillator block from the system of FIG. 2 and having a plurality of inputs and an output for producing a timing or clock signal, according to the present invention.

With reference to these Figures, and, in particular, to FIG. 2 that globally and schematically illustrates a configurable oscillator system realized according to an embodiment for obtaining a dynamic tuning of the timing/clock frequency produced at the output. This oscillator system 1 comprises an oscillator block 2, for example, of the type illustrated in FIG. 3, having a plurality n inputs receiving respective input signals ($in_1$, $in_2$, ... $in_n$) for producing, on a single output OUT, a clock signal.

The clock signal is fed into the input of a frequency divider block 3 by means of a feedback connection 7. The frequency divider block 3 receives, on an input, an enable signal 9 for carrying out a frequency division and outputs a frequency value divided by a predetermined factor. The frequency divider block 3 can be implemented, for example, with a counter with configurable maximum value, even if other alternative approaches can be adopted according to the needs of a particular application.

Figure 4:
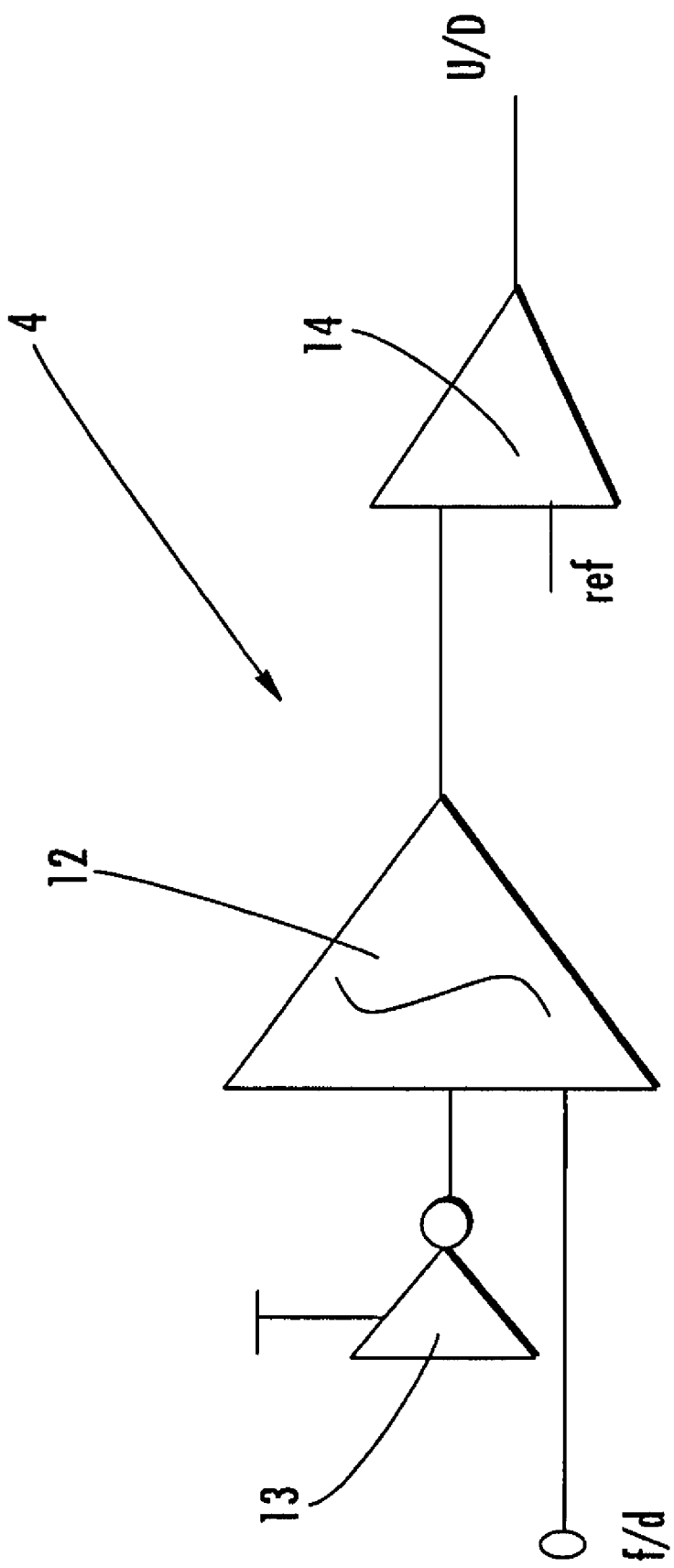
FIG. 4 illustrates a schematic view of a tuning block from the system of FIG. 2, according to the present invention.

The output of the frequency divider block 3 is applied at the input of a tuning block 4 comprising an integrator, which is illustrated in greater detail with reference to FIG. 4. The main task of this tuning block 4 is that of transforming a frequency into a measurable and comparable electric magnitude, for example, into a voltage value compared with a reference voltage.

The tuning block output 4 is applied to an input of a control block 5 of the oscillator 2, which produces a plurality of n outputs applied to the corresponding inputs of the oscillator block 2. The tuning block 4 is schematically illustrated in FIG. 4 and comprises an integrator 12 having a first input receiving a signal f/d, which represents the divided clock frequency value produced at the output by the divider block 3, and a second input receiving a reference value through a logic gate 13, for example, an inverter.

The integrator 12 may provide transformation of the signal received in frequency into a measurable electric magnitude, for example, into a voltage signal, and comparison of this value with a reference value. As a result, the tuning block 4 produces an electric signal, which through an optional logic gate 14 is applied at the input to the control block 5.

Figure 5:
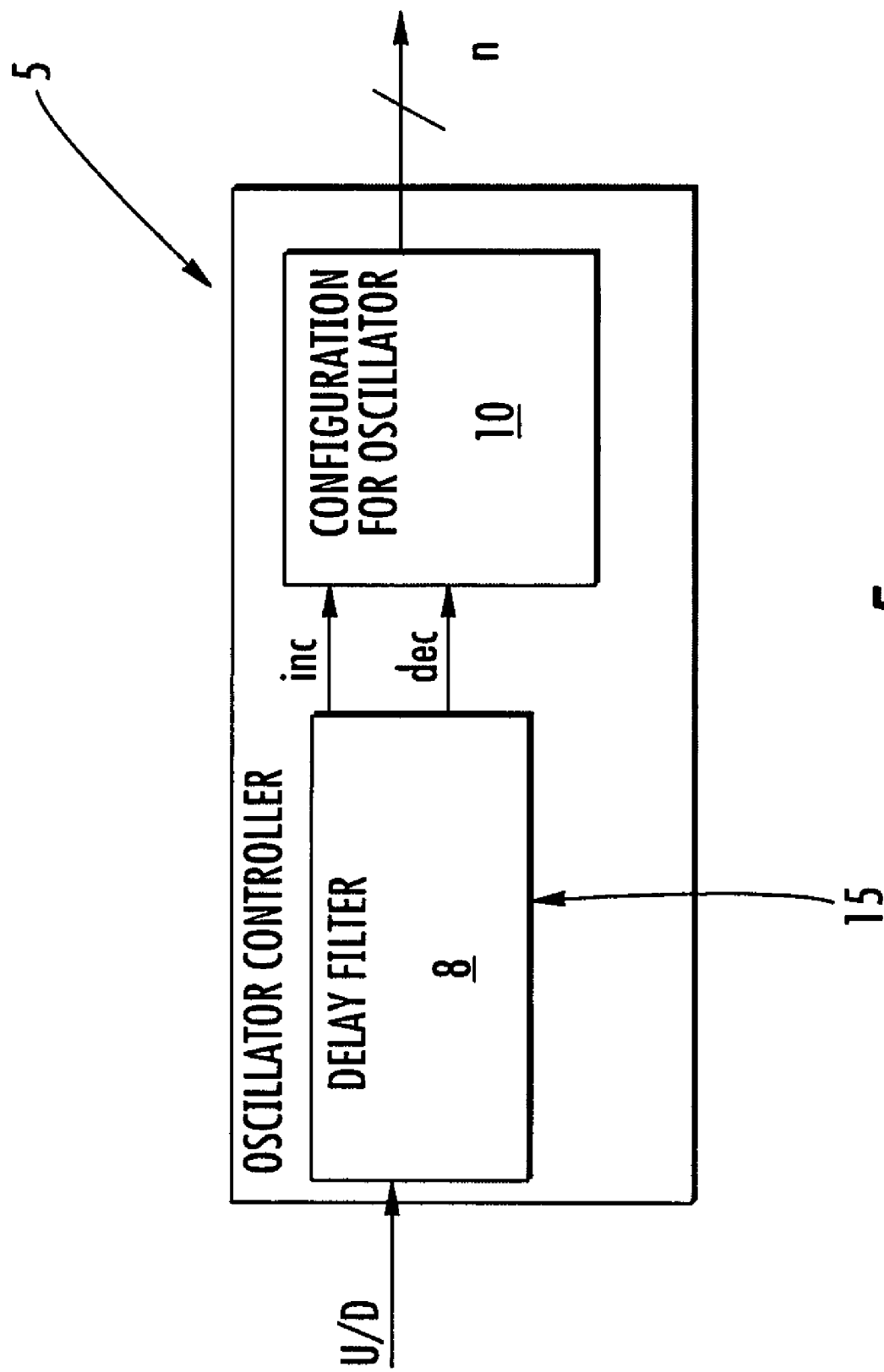
FIG. 5 illustrates a schematic view of a control block from the system of FIG. 2, according to the present invention.

This control block 5 is schematically illustrated in FIG. 5 and comprises a reversible or bi-directional counter 8, i.e. of the Up/Down type, which serves as delay filter and operates on the basis of an enable signal to the counting received from the preceding tuning block 4. In particular, the counter 8 illustrates a pre-set at half of the forced counting range by means of a reset external signal 15. The counter 8 illustrates two outputs, inc and dec, which represent the respective incremental and decremental values of the counting. These two outputs are applied to a configuration block 10, provided, for example, by means of a counter with plural outputs, which produces an n plurality of outputs, as many as the inputs of the oscillator block 2, for allowing its configuration.

In summary, the architecture of the oscillator system 1 according to this embodiment may comprise: the oscillator block 2 configurable in frequency through the n inputs ($in_1$, $in_2$, ... $in_n$), the frequency divider 3 which can be realized by means of a counter with maximum configurable value; the integrator circuit 4 which transforms a frequency into a measurable electric value, for example, a voltage, and compares it with a reference value; the up-down counter 8 being pre-set 15 at half of the counting range; a counter 10 having at the output the value of the current configuration of the oscillator; and an optional nonvolatile register to be used in the calibration step, as it may be seen hereafter.

Once the range of the obtainable frequencies has been set, the number of the inputs n of the oscillator 1, and thus, of its possible configurations, is directly related to the clock accuracy. In fact, as the value n increases, the distance between a configuration and the successive configuration is decreased, allowing the actual frequency to better approximate the target frequency $f_{TARGET}$.

The oscillator system 1 may operate as follows. At the turn-on, the counter 10 serving as configuration block is initialized at the minimum configuration of the oscillator block 2. This oscillator block 2 generates, in consequence, a clock signal at the minimum frequency (fm) for which it has been designed. This frequency (fm), of value not defined ahead of time due to the variations of temperature, voltage, and process, is divided by the frequency divider block 3 for a number of times equal to those assigned through the configuration coded in the division signal 9.

The oscillation obtained is then converted by the tuning block 4 into an electric magnitude, for example, a voltage, which can thus be compared with a reference value. The result of the comparison performed by the tuning block 4 indicates if the frequency is higher or lower than the one desired.

For avoiding quick fluctuation in the frequency due to, for example, the presence of noise, which may be taken into consideration, the controller block 5 may comprise the reversible counter 8 (Up/Down) evaluating the result of the comparison coming from the tuning block 4 at each clock count, however, already divided in the block 3. Only when a defined number of up or down requests (in the counting Up/Down) have been collected, i.e. when this counter 8 has reached its stroke end upwards or downwards, an enable signal is emitted (increase or decrease) at the change of the oscillator configuration 2.

This configuration is maintained for the whole operation carried out by the counter 10 already mentioned. The calibration or tuning method continues as long as the number of down requests (Down) by the tuning block 4 does not overcome the up ones (Up). Once this situation has been reached, the system 1 remains "hooked" and the configuration of the oscillator 2, and in consequence, its frequency is alternatively changed between the two nearest frequencies to the one searched (in particular the upper one is nearer and the lower one nearer to the value searched).

The dimension of the counter 8 serving as delay filter determines the inertia with which these two configurations are alternated. Therefore, according to this embodiment, the problem of the search of an accurate frequency then becomes the problem of the search of a very accurate electric magnitude, for example, a reference voltage. This voltage is of simple and common implementation by using for example architectures of the band gap type.

Figure 6:
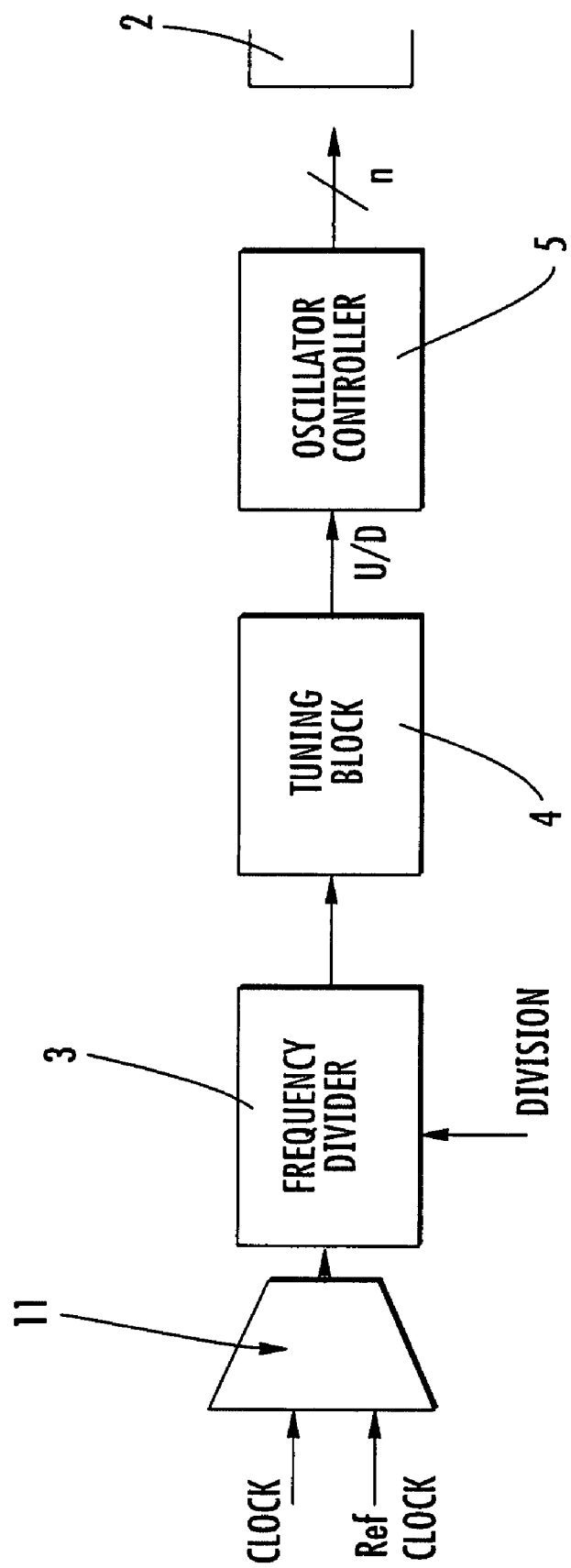
FIG. 6 illustrates a schematic view of another embodiment of the oscillator system, according to the present invention.

What has been exposed up to now aims at showing how the oscillator system 1 can chase a stable reference value independently from the supply and from the temperature, provided, however, that the reference voltage is stable as well. Process variations on all the parts of the circuit, and, in particular, on the integrator and comparator 12 in the tuning block 4, however make the frequency to which the structured is hooked unpredictable from device to device Each device in fact may have a frequency to which the oscillator system may be hooked and this may vary under different voltage and temperature conditions, but, due to the process deviations, this frequency may be different for each device. In order to compensate for this problematic effect, a practical calibration system has been provided to be carried out during the final test on semiconductor wafer of the devices thus realized, this approach may use few additional logic gates and it is illustrated in FIG. 6, while the relative method is illustrated in the flow chart of FIG. 7.

A multiplexer 11 has been provided upstream of the frequency divider block 3. This multiplexer 11 is input the clock signal and the clock reference, indicated with ref clock. The multiplexer 11 decides whether the input of the circuit is the clock signal coming from the oscillator 2, in the normal operation, or if it may be the reference clock signal coming from the outside, in the calibration mode.

With this approach, for calibrating the oscillator system 1 during the final test, it is thus enough to open the loop already described (i.e. the feedback connection 7) bringing to this structure a reference clock rather than the one generated by the oscillator. The frequency of this reference clock is that at which the system may have to operate, and thus, the one that the tuning block 4 may have to recognize and which should be such as to make its comparator start.

The value of the signal 9 is initially imposed at a minimum value, and then increased at regular intervals. A value is reached for which the integrator 12 of the tuning block 4 changes state. The repetition of this condition makes the signal inc enhance. Once such a condition has been reached, the calibration has ended. The value of the enable signal 9 in this state is that for which a frequency put at the input of the multiplexer 11 (the reference one, or the one of the oscillator in the normal mode). In consequence, the value of the electric magnitude (for example the voltage), wherein the tuning block 4 transforms it, is such as to be identified as the one closest to the reference in the circuit. This value of the signal 9 can be stored in a nonvolatile register (not illustrated since conventional) and used for the device under calibration so that it is synchronized at the desired frequency.

Figure 7:
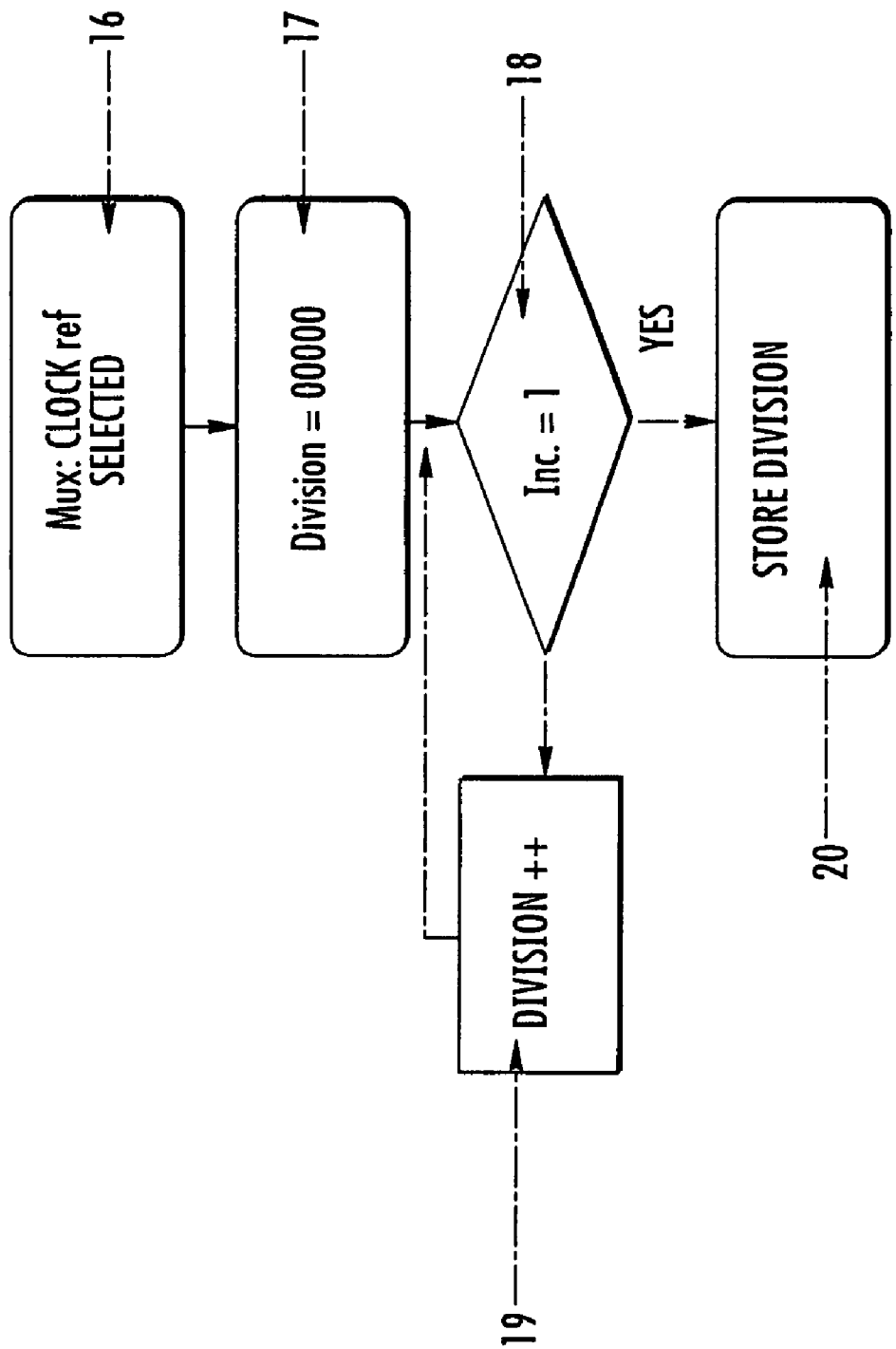
FIG. 7 illustrates a flow chart of the tuning method, according to the present invention.

In the flow chart of FIG. 7, the end calibration method is illustrated. After a first selection operated by the multiplexer 11, step 16, the frequency division is carried out by the block 3, step 17. A test step 18 checks the increase of the output inc of the counter 8; if the increase has occurred, the value is stored in a non volatile register, step 20, otherwise the value is increased for the signal 9 applied to the frequency divider block 3, step 19.

The accuracy of the frequency is an important characteristic in an oscillator. From the relations (1)-(3), it has been seen that this is strongly influenced by the magnitude of the error E, due to: process variation, temperature variation, and supply voltage variation. The architecture provided may allow the reduction of the error E due to the process variation, to the temperature variation, and to the supply voltage variation, by dynamically chasing a reference value stored as a register in the calibration step.

The approach provided may allow for the compensation for slow variations of voltage and temperature by adapting the configuration of the oscillator to the different external conditions so as to reach a high accuracy of the clock frequency. The structure realized may allow for making the most critical analog parts work under the same operative conditions independently from the frequency used by the system. Moreover, the calibration operation may permit the adaptation of the system for operating and hooking to any frequency value attainable by the oscillator.

The invention claimed is:

1. An oscillator system comprising:
   an oscillator block having a plurality of inputs and outputting a clock signal;
   a frequency divider block receiving the clock signal and outputting a divided clock signal;
   a tuning block including an integrator for receiving the divided clock signal and a first reference value, and for integrating the divided clock signal using the first reference value, and outputting a comparison signal; and
   a control block coupled to said tuning block, said control block receiving the comparison signal and comprising
      a configuration block for producing a plurality of outputs for the corresponding inputs of said oscillator block, and
      an Up/Down counter having outputs applied to said configuration block.

2. The oscillator system according to claim 1 wherein said frequency divider block comprises a counter with a configurable value.

3. The oscillator system according to claim 1 wherein said tuning block comprises:
   a comparator for comparing the integrated divided clock signal with a second reference value and producing the comparison signal.

4. The oscillator system according to claim 1 wherein said Up/Down counter comprises a delay filter and receives a reset signal for forcing a pre-set at half counting.

5. The oscillator system according to claim 1 wherein said configuration block comprises a counter for producing on the plurality of outputs a value of a current configuration of said oscillator block.

6. The oscillator system according to claim 1 further comprising a multiplexer positioned upstream to said frequency divider block and for receiving the clock signal and a reference clock signal.

7. The oscillator system according to claim 1 wherein said frequency divider block receives an enable signal indicating a factor of a division operation of said frequency divider block.

8. The oscillator system according to claim 1 further comprising a logic gate upstream of said integrator for generating the first reference value.

9. An oscillator system comprising:
   an oscillator block having a plurality of inputs and outputting a clock signal;
   a multiplexer receiving the clock signal and a reference clock signal and outputting the reference clock signal during a calibration mode;
   a frequency divider block receiving an output of said multiplexer and outputting a divided clock signal;
   a tuning block including an integrator for receiving the divided clock signal and a first reference value, and for integrating the divided clock signal using the first reference value, and outputting a comparison signal; and
   a control block coupled to said tuning block, said control block receiving the comparison signal and comprising
      a configuration block for producing a plurality of outputs for the corresponding inputs of said oscillator block, and an Up/Down counter having outputs applied to said configuration block.

10. The oscillator system according to claim 9 wherein said frequency divider block comprises a counter with a configurable value.

11. The oscillator system according to claim 9 wherein said tuning block comprises:
a comparator for comparing the integrated divided clock signal with a second reference value and producing the comparison signal.

12. The oscillator system according to claim 9 wherein said Up/Down type counter comprises a delay filter and receives a reset signal for forcing a preset at half counting.

13. The oscillator system according to claim 9 further comprising a logic gate upstream of said integrator for generating the first reference value.

14. A method for dynamically tuning a clock frequency from by an oscillator comprising at least one oscillator block, the oscillator block having a plurality of inputs and outputting a clock signal, the method comprising:
dividing the clock signal produced by the oscillator block with a frequency divider block;
integrating the divided clock signal from the frequency divider block into an electric magnitude signal with a tuning block having an integrator using a received first reference value;
comparing the electric magnitude signal with a reference signal in the tuning block; and
applying a signal from the comparing to a control block comprising an Up/Down counter and a configuration block for the oscillator block, the applying for regulating values of the plurality of inputs.

15. The method according to claim 14 wherein an enable signal is applied to the frequency divider block, the enable signal representing a factor of a division operation of the frequency divider block.

16. The method according to claim 14 wherein a multiplexer is provided upstream of the frequency divider block for selecting the clock signal or a reference clock signal.

17. The method according to claim 14 wherein a logic gate upstream of the integrator generates the first reference value.

* * * * *

UNITED STATES PATENT AND TRADEMARK OFFICE
CERTIFICATE OF CORRECTION

| | |
|---|---|
| PATENT NO. | : 7,622,997 B2 |
| APPLICATION NO. | : 11/770138 |
| DATED | : November 24, 2009 |
| INVENTOR(S) | : Amato et al. |

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 37 days.

Column 3, Line 60     Delete: "as delay"
                      Insert: --as a delay--

Column 5, Line 8      Delete: "device"
                      Insert: --device.--

Column 7, Line 18     Delete: "by"

Signed and Sealed this

Fourteenth Day of September, 2010

David J. Kappos
*Director of the United States Patent and Trademark Office*